Figure 1:
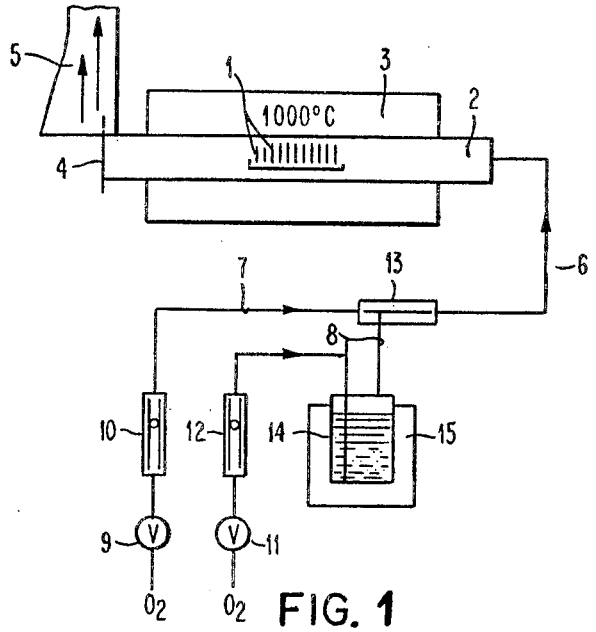
Figure 2:
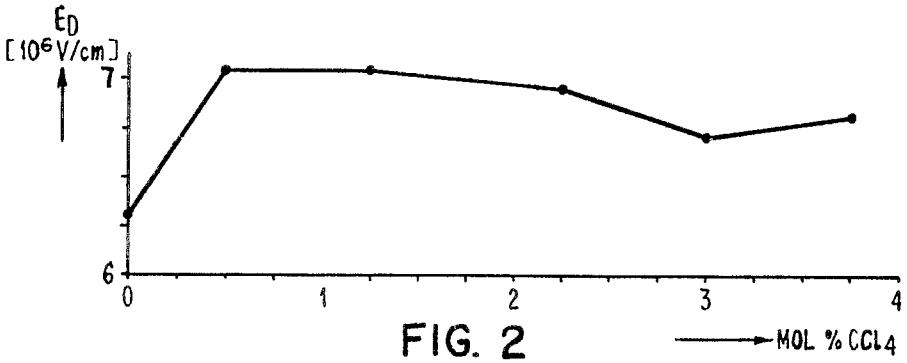
Figure 3:
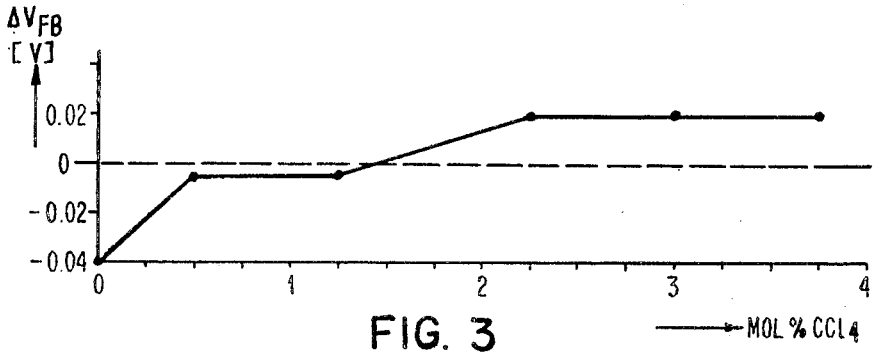

United States Defensive Publication [19] (H) [11] T954,009

Malin et al. [43] Jan. 4, 1977

[54] METHOD FOR THE THERMAL OXIDATION OF SILICON WITH ADDED CHLORINE

[75] Inventors: Konrad Malin, Dettenhausen; Dietrich Seybold, Boeblingen, both of Germany

[73] Assignee: International Business Machines Corporation, Armonk, N.Y.

[21] Appl. No.: 596,498

[22] Filed: July 16, 1975

Related U.S. Application Data

[63] Continuation of Ser. No. 439,491, Feb. 4, 1974.

[30] Foreign Application Priority Data

Mar. 24, 1973 Germany ..... 2314746

[51] Int. Cl.[2] ..... B05D 5/12

[52] U.S. Cl. ..... 427/93; 427/399

[57] ABSTRACT

The dry thermal oxidation of silicon semiconductor material to produce an oxide layer, such as the gate oxide of a field effect transistor, is carried out by flowing oxygen over the surface of the semiconductor at an elevated temperature to form a layer of silicon oxide. The electrical properties of the layer are improved by adding chlorine to the oxygen in the form of between 0.2 and 5.0 mol % of carbon tetrachloride in order to introduce chlorine into the growing oxide layer.

5 Claims, 1 Sheet Drawing,

11 Pages Specification

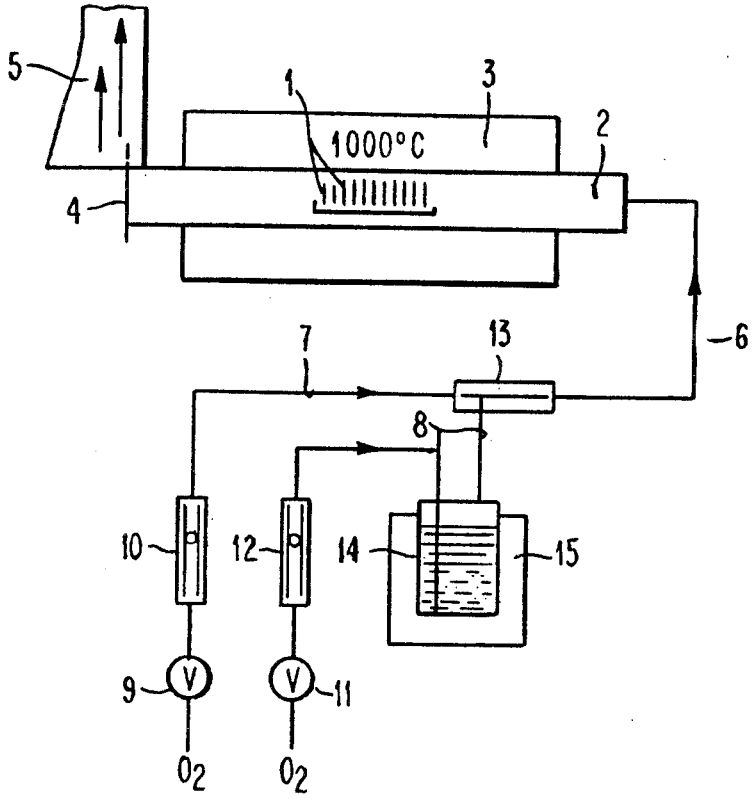

The file of this unexamined application may be inspected and copies thereof may be purchased (849 O.G. 1221, Apr. 9, 1968).